United States Patent [19]

Hannon et al.

[11] 4,062,002
[45] Dec. 6, 1977

[54] DEVICE FOR BIASING BUBBLE DOMAINS

[75] Inventors: David Malcolm Hannon, Palo Alto; Hung Liang Hu, Sunnyvale, both of Calif.

[73] Assignee: International Business Machines Corporation, Armonk, N.Y.

[21] Appl. No.: 737,881

[22] Filed: Nov. 1, 1976

[51] Int. Cl.$^2$ .................................................. G11C 19/08
[52] U.S. Cl. ........................................ 365/27; 365/19
[58] Field of Search ................................. 340/174 TF

[56] References Cited
U.S. PATENT DOCUMENTS 3,913,079  10/1975  Rosier ........................... 340/174 TF Primary Examiner—James W. Moffitt
Attorney, Agent, or Firm—Joseph E. Kieninger

[57] ABSTRACT

A device adapted for biasing bubble domains in a low externally applied magnetic bias field. This device is suitable for use when isolated bubbles or a column of bubbles are translated to or from a bubble lattice. The device has a pair of parallel channels, each containing a stripe domain therein. Positioned between the pair of channels is a channel for the translation of isolated bubbles. Positioned in juxtaposition with the bubble containing channel and the pair of stripe containing channels are a pair of parallel conductors. The passage of current through one conductor in one direction and a current through the other conductor in the opposite direction together with the presence of the stripe domains in the two channels provide a biasing field around the channel containing the bubbles which permits the isolated bubble operating margin to overlap the lattice operating margin.

10 Claims, 3 Drawing Figures

DEVICE FOR BIASING BUBBLE DOMAINS

FIELD OF THE INVENTION

This invention relates to a bubble biasing device, and more particularly, to a bubble biasing device adapted for use in the translation of isolated bubbles to and from a bubble lattice.

BRIEF DESCRIPTION OF PRIOR ART

Bubble domains arranged in lattice are described in copending U.S. patent application, Ser. No. 395,336 filed on Sept. 7, 1973 and now abandoned. As described therein, the bubble domain lattice consists of a plurality of rows and columns of bubble domains which occupy a spatial arrangement which is determined to a substantial extent by the interaction between the bubbles.

Column accessing of bubble domains in a lattice are described in copending U.S. patent application Ser. No. 429,601 filed on Jan. 2, 1974 and assigned to the assignee of the present invention. As described therein, means and a method are provided for removing the elements in a direction substantially transverse to the direction of the translational movement within the confined array. Columns of magnetic bubble domains in the lattice array of bubble domains can be accessed with this technique. After the bubbles have been accessed from the bubble lattice they are translated to a read station. At the read station means are employed to detect the difference in the bubbles which have been coded in terms of the wall magnetization rotation. This type of coding is described in more detail in U.S. Pat. No. 3,890,605, which issued on June 17, 1975. Briefly, magnetic bubbles can be made to deflect through different angles in a gradient magnetic field normal to the magnetic medium depending on the number of rotations of their wall magnetization. Thus, means are described so that the column access channel from the bubble lattice leads into a Y-shaped channel in order to allow the bubble domains to be deflected into either one of the legs of the Y-shaped channel. Sensors then detect the bubble domains and an indication is obtained of the information contained within the lattice. In such a system, the bubble lattice portion requires an externally applied bias field between 0 and 0.4 ($4\pi Ms$) for example, 30 Oe, in the case of $5\mu M$ bubbles, whereas isolated bubbles require a much higher bias field, for example, of the order of 60 to 64 Oe in the case of $5\mu m$ bubbles. Hence, the bias field requirement for a lattice and for an isolated bubble are not compatible.

One approach to overcome this problem has been to change the thickness of the magnetic material between the lattice area and the isolated bubble area so that it is thinner near the isolated bubble area. For example, in a system using $5\mu$ bubbles, the thickness is $3.5\mu$ in the lattice area and 1.2 to $2.5\mu$ in the isolated bubble areas. Between these two areas, the thickness changes from $3.5\mu$ to 1.2 to $2.5\mu$. In such a case the bias field requirement of about 60 Oe for 3.5 micron thickness decreases for the thinner channels to about 46 Oe for 2.5 microns and about 38 Oe for 1.5 micron thickness. While this approach is an improvement over the prior art, it also has some disadvantages. For example, thinning down the film of magnetic material requires one level of registration with a corresponding fabrication step. The different thickness steps of the film also may cause a change in the wall state. Another disadvantage of this approach is that the use of detection in an isolated bubble mode nullifies the advantages, for example, of wide operating margins, that a close pack bubble lattice configuration has over the isolated bubble T & I bar type devices.

Another well known approach is to employ a conductor line to provide a bias field for the bubble channel. A current of 40 MA in the conductor reduces the external bias field from about 60 Oe to 50 Oe and provides an isolated bubble operating margin of about 18 Oe. The disadvantage of this approach is that the current level is high.

Another approach to overcome this problem is described in copending U.S. patent application Ser. No. 638,203 filed on Dec. 5, 1975. As described therein, the device consists of a Y-shaped channel in which bubbles are propagated between a bubble lattice column and either detector means or generator means. A magnetic pattern surrounding the Y-shaped channel such as a bubble lattice, stripe domains, or regions of reduced magnetism, is controlled to yield a self-biasing magnet field which enables the device to retain the advantages of the close bubble packing in a bubble lattice for the detection and generation operations. While this system does provide wide operating margins, it does not afford the design flexibility which is desired in certain circumstances.

SUMMARY OF THE INVENTION

It is the primary object of this invention to provide an improved bubble biasing device.

It is another object of this invention to provide a device for providing a bias field for use when isolated bubbles are moved to and from a bubble lattice device.

It is yet another object of this invention to provide a biasing device suitable for use with lattices in the presence of a relatively low externally applied bias field.

It is yet still another object of this invention to provide a device for providing a bias field which enables isolated bubbles to have a bubble operating margin which overlaps the lattice operating margin.

These and other objects are accomplished by a device adapted for biasing isolated bubbles in a low externally applied magnetic bias field. The device is suitable for use when isolated bubbles or a column of bubbles are translated to or from a bubble lattice. The device has a pair of parallel channels, each containing a stripe domain therein. Positioned between the pair of channels is a channel for the translation of isolated bubbles. Positioned in juxtaposition with the bubble containing channel and the pair of stripe containing channels are a pair of parallel conductors. The passage of current through one conductor in one direction and a current through the other conductor in the opposite direction together with the presence of the stripe domains in the two channels provide a biasing field around the channel containing the bubbles which permits the isolated bubble operating margin to overlap the lattice operating margin.

Other objects of this invention will be apparent from the following detailed description, reference being made to the accompanying drawings wherein a preferred embodiment of invention is shown.

DESCRIPTION OF THE ILLUSTRATED EMBODIMENT

Figure 1:
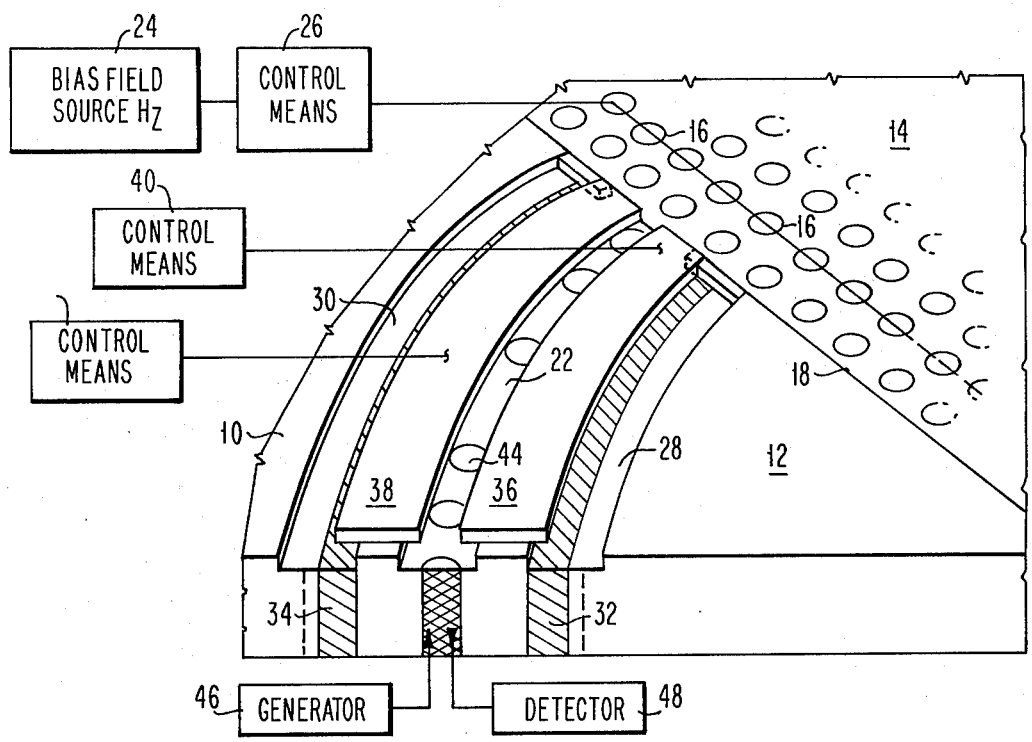
FIG. 1 is a detailed diagram partly in cross section and partly schematic of the device in accordance with this invention.

As shown in FIG. 1 a device 10 has a layer of bubble material 12 on a substrate (not shown). In a portion of the bubble material layer 12 is a bubble lattice containing bubbles 16. The bubbles 16 contain bits of storage information which are represented by different states of the bubble, for example, and S equals 0 bubble, that is a bubble containing one pair of Bloch lines and an S equals 1 bubble, containing no Bloch lines. The bubble lattice 14 is confined by a barrier 18. The barrier 18 may be a dam, groove, conductor or any other well known barrier as is used in the art. Barrier 18 has an opening 20 which permits bubbles to be translated into or out of a particular column in the lattice 14 from a channel 22. Channel 22 is used for the translation of single bubbles or for a column of bubbles in an isolated bubble mode. An external bias field source 24 having control means 26 provides an external bias field about the bubble lattice 14 of between 0 and 0.4 ($4\pi M_s$), wherein $M_s$ is the magnetization of the bubble film material. Typically, for five micron bubbles, the bias field is of the order of 0 to 40 Oe with the preferred value being between 25 to 35 Oe.

In accordance with this invention, the device 10 includes at least one pair of parallel channels 28 and 30 positioned on either side of the bubble channel 22. Positioned in channel 28 and channel 30 are stripe domains 32 and 34 respectively. The width of the channels 28 and 30 is between 20 to 40% greater than the width of the stripe domains that are formed in the film at zero bias field. While the channels 28 and 30 and the stripe domains 32 and 34 are curved in FIG. 1, it is understood that these parallel channels may be straight, curved, or form an open ended loop. This feature enhances its design flexibility. The channels 28 and 30 may be in the form of a groove. The depth of the groove is of the order of 0.1 to 1$\mu$. Each of the stripe domains 32 and 34 in the channels 28 and 30 respectively may be a single elongated stripe in each channel as shown or a plurality of shorter stripe domains positioned end to end.

Another embodiment not shown in drawings would include having one or more additional pairs of channels adjacent channels 28 and 30. These additional channels may contain single stripes, a plurality of stripes or a plurality of bubbles therein.

Further, in accordance with this invention are a pair of parallel conductors 36 and 38 which are in juxtaposition with channels 28 and 30 respectively. The current in the conductors 36 and 38 flow in opposite directions. In general, conductors 36 and 38 are not in electrical contact. However, conductors 36 and 38 may be connected to form an open ended loop so that the current still flows in opposite directions. Control means 40 and 42 control the amount and direction of the current that passes through conductors 36 and 38 respectively. The bubbles 44 in the channel 22 are either generated by the generator 46 and go through the opening 20 to the lattice 14 or come from the lattice 14 through the opening 20 and to the detector 48.

Figure 2:
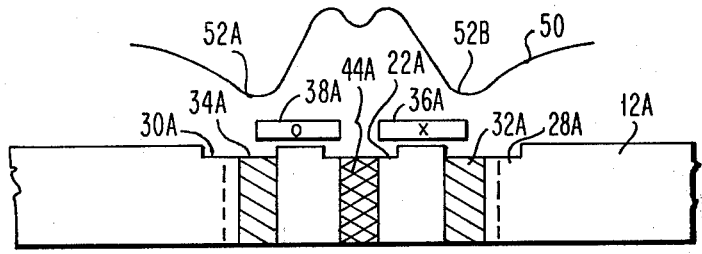
FIG. 2 is a cross sectional view of the device including the relationship between the conductor field effect and the position of the stripe domains.

The operation of the device for the translation of bubbles from the generator to the lattice and from the lattice to the detector will now be discussed in detail by reference to FIG. 2. The layer of bubble material 12A has channels 28A and 30A containing stripe domains 32A and 34A. Positioned between channels 30A and 32A is channel 22A which contains bubbles 44A. Positioned in juxtaposition with channel 28A and 44A is conductor 36A in which the current goes in the first direction. A second conductor 38A is positioned in juxtaposition to channel 30A and channel 22A. The current in conductor 38A passes in a direction opposite to that in 36A. The position of conductor 36A and 38A determine the position of the stripe domains 32A and 34A in channels 28A and 38A respectively. Superimposed in FIG. 2 is a plot of the magnetic field from the conductors 36A and 38A positioned to correspond with their position on the device. The field from the conductors is shown by line 50. The field well 52 on the curve 50 determines the lateral position of the stripe in the channel. The position of the two conductors is arranged so that the field wells 52A and 52B fix or pin the stripe 32A and 34A to the edge of the channel closer to the bubble channel 22A. Since the bias field from the stripes 32A and 34A combine with the bias field from the current in the conductors 36A and 38A, less current is needed in the conductors 36A and 38A to provide the required bias field for the bubble channel. As the external bias field (not shown) decreases, it causes the stripe domain to expand in width. As the stripe domain expands in width, the biasing effect from the stripe domain increases, thereby lowering the lower operating boundary of the device. As the external bias field increases, it causes the stripe domain to contract in width. As the stripe domain contracts in width, the biasing effect from the stripe domain decreases, thereby raising the upper operating boundary of the device. The combination of lowering the lower operating boundary and raising the upper operating boundary and raising the upper operating boundary results in increasing the operating margin of the device.

Figure 3:
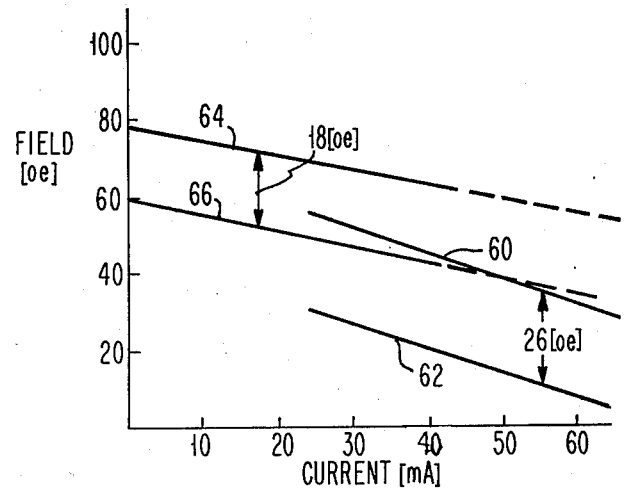
FIG. 3 illustrates a comparison between the device operating margin in accordance with this invention and the operating margin of the device having only conductors.

As shown in FIG. 3 in accordance with this invention, the margin obtainable with the conductors in combination with the stripe domains is shown by the curves 60 and 62. Bubbles satisfactorily operate between the curve 60 and 62. Above line 60, the bubbles collapse and below line 62, the bubbles stripe out. The measured margin between line 60 and 62 is 26 Oe. In contrast, the use of a conductor alone provides the margin between the curves 64 and 66. The operating margin, that is, the distance between 64 and 66 is 18 Oe. Hence, the operating margin in accordance with this invention is 26 Oe in contrast to a conductor alone which is 18 Oe, an improvement of almost 50%.

Although several preferred embodiments of this invention have been described, it is understood that numerous variations may be made in accordance with the principles of this invention.

What is claimed:

1. A device having a film of bubble material on a substrate and adapted for the use in an external bias field between 0 and 0.4 ($4\pi M_s$) comprising:
   a first channel in said film having a first stripe domain therein, said first channel being of sufficient width to permit said first stripe domain to expand in width when said external bias field is lowered wherein the flux from said first stripe increases to counteract the effect of the lower external bias field, a second channel in said film having a second stripe domain therein, said second channel being parallel to said first channel, said second channel being of sufficient width to permit said second stripe domain to expand in width when said external bias field is lowered wherein the flux from said second stripe increases to counteract the effect of the lower external bias field, a third channel in said film positioned between said first channel and said second channel and adapted for the movement of a bubble there-through, a first conductor in juxtaposition with said first channel and said third channel and adapted for the current therein to flow in a first direction, said first conductor fixing the position of said first stripe domain in said first channel and causing said first stripe domain to expand in width in said first channel, and a second conductor in juxtaposition with said second channel and said third channel and adapted for the current therein to flow in a direction opposite said first direction, said second conductor fixing the position of said second stripe domain in said second channel and causing said second stripe domain to expand in width in said second channel, wherein the passage of current through said first and second conductors and the presence of said first and second stripe domains provide a biasing field around said third channel to increase the operating margin of said device.

2. A device as described in claim 1 wherein said first conductor is connected to said second conductor to form an open ended loop.

3. A device as described in claim 1 wherein said third channel is associated with generator means.

4. A device as described in claim 1 wherein said third channel is associated with detector means.

5. A device as described in claim 1 wherein said third channel is associated with a bubble lattice.

6. A device as described in claim 5 wherein said grooves have a width 20 to 40% greater than the width of the stripe domains that are formed in the film at zero bias field.

7. A device as described in claim 1 wherein said first and second channels are grooves in said film having a depth of 0.1 to $1\mu$.

8. A device as described in claim 1 wherein said first channel contains a plurality of stripe domains positioned end to end.

9. A device as described in claim 1 wherein at least one pair of additional parallel channels having a stripe domain therein are positioned in said films so that one channel of said pair is located adjacent said first channel and other channel of said pair is located adjacent said second channel.

10. A device as described in claim 9 wherein said additional channels are adapted to contain a plurality of bubbles therein.

* * * * *